United States Patent
Bulovic et al.

(10) Patent No.: US 11,935,977 B2
(45) Date of Patent: Mar. 19, 2024

(54) TRANSFERABLE ULTRA-THIN SUBSTRATES AND RELATED TECHNIQUES

(71) Applicant: Massachusetts Institute of Technology, Cambridge, MA (US)

(72) Inventors: Vladimir Bulovic, Lexington, MA (US); Mayuran Saravanapavanantham, Cambridge, MA (US); Jeremiah Mwaura, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 17/938,180

(22) Filed: Oct. 5, 2022

(65) Prior Publication Data
US 2023/0104867 A1    Apr. 6, 2023

Related U.S. Application Data

(60) Provisional application No. 63/252,974, filed on Oct. 6, 2021.

(51) Int. Cl.
*H01L 31/18* (2006.01)
*H01L 31/0224* (2006.01)
*H01L 31/0468* (2014.01)

(52) U.S. Cl.
CPC .. *H01L 31/0468* (2014.12); *H01L 31/022441* (2013.01); *H01L 31/022466* (2013.01); *H01L 31/1896* (2013.01)

(58) Field of Classification Search
CPC ...... H10K 77/111; H10K 71/80; H10K 39/10; H01L 25/162; H01L 31/1896
See application file for complete search history.

(56) References Cited

U.S. PATENT DOCUMENTS

| 7,410,542 B2 | 8/2008 | Nolan et al. |
| 7,466,390 B2 | 12/2008 | French et al. |
| 2015/0228916 A1* | 8/2015 | Bulovic .............. H10K 77/111 136/263 |
| 2017/0012202 A1* | 1/2017 | Izumi ................... B32B 43/006 |

FOREIGN PATENT DOCUMENTS

KR    20130037275 A  *  4/2013    ....... H01L 29/78603

OTHER PUBLICATIONS

HUANG ("Efficient and Mechanically Robust Ultraflexible Organic Solar Cells Based on Mixed Acceptors") Joule 4, 128-141 (Year: 2020).*
JEAN ("In situ vapor-deposited parylene substrates for ultra-thin, lightweight organic solar cells") Organic Electronics 31 (2016) 120e126 (Year: 2016).*
English machine translation of KR 20130037275 A (Year: 2023).*

(Continued)

*Primary Examiner* — Angelo Trivisonno
(74) *Attorney, Agent, or Firm* — Daly, Crowley, Mofford & Durkee, LLP

(57) ABSTRACT

A device, comprising: a flexible carrier; a release layer that is formed on the flexible carrier; a releasable substrate formed over the release layer; and a semiconductor structure that is formed over the releasable substrate.

20 Claims, 14 Drawing Sheets

(56) References Cited

OTHER PUBLICATIONS

Choi et al. "Wearable red-green-blue quantum dot light-emitting diode array using high-resolution intaglio transfer printing", May 14, 2015, 8 pages.
Hu et al. "Scalable coating and properties of transparent, flexible, silver nanowire electrodes", Apr. 21, 2010, 9 pages.
Huang et al. "Ultraflexible Organic Solar Cells Based on Mixed Acceptors", Jan. 15, 2020, 15 pages.
Jean et al. "In situ vapor-deposited parylene substrates for ultra-thin, lightweight organic solar cells", 2019, 13 pages.
Jimbo et al. "Ultraflexible Transparent Oxide/Metal/Oxide Stack Electrode with Low Sheet Resistance for Electrophysiological Measurements", ACS Appl. Mater. Interfaces. 9, Sep. 21, 2017, 30 pages.
Jinno et al. "Stretchable and waterproof elastomer-coated organic photovoltaics for washable electronic textile applications", 2017, 6 pages.
Kaltenbrunner et al. "An ultra-lightweight design for imperceptible plastic electronics", Jul. 25, 2013, vol. 499, 8 pages.
Kaltenbrunner et al. "Ultrathin and lightweight organic solar cells with high flexibility", Apr. 3, 2012, 7 pages.
Miskin et al. "Electronically integrated, mass-manufactured, microscopic robots", Aug. 26, 2020, 9 pages.
Reese et al. "Increasing markets and decreasing package weight for high-specific-power photovoltaics", Nov. 5, 2018, 30 pages.
Sekitani et al. "Flexible organic transistors and circuits with extreme bending stability", Nov. 7, 2010, 20 pages.
Søndergaard et al. "Roll-to-roll fabrication of polymer solar cells", Jan.-Feb. 2012, vol. 15, No. 1-2, 14 pages.
Xu et al. "Thermally stable, highly efficient, ultraflexible organic photovoltaics", Jan. 21, 2018, 6 pages.
Zhang et al. "Single-layered organic photovoltaics with double cascading charge transport pathways", 2021, 10 pages.
Cominetti et al. "Solution-Processable Anode Double Buffer Layers for Inverted Polymer Solar Cells", Advanced Science News, Mar. 11, 2020, 9 pages.
Green et al. "Solar Cell Efficiency Tables", (version 57), Prog. Photovoltaics Res. Appl. 29, 43 pages.
Huang et al. "Efficient and Mechanically Robust Ultraflexible Organic Solar Cells Based on Mixed Acceptors", Cell Press, Jan. 15, 2020, 15 pages.
Kang et al. "Scalable Microfabrication Procedures for Adhesive-Integrated Flexible and Stretchable Electronic Sensors", Sep. 16, 2015, 18 pages.
Kim et al., "Highly Conductive PEDOT:PSS Electrode with Optimized Solvent and Thermal Post-Treatment for ITO-Free Organic Solar Cells", Advanced Function Materials, Feb. 15, 2011, 7 pages.
Kimura et al. "High Operation Stability of Ultraflexible Organic Solar Cells with Ultraviolet-Filtering Substances", Advanced Materials, Mar. 28, 2019, 6 pages.
Lee et al."Peel-and-Stick: Mechanism Study for Efficient Fabrication of Flexible/ Transparent Thin-film Electronics", Oct. 10, 2013, 6 pages.
Lee "Transfer Printing Methods for Fabricating Thin-Film Electronics on Nonconventional Substrates" Aug. 2013, 186 pages.
Park et al. "Self-Powered Ultra-Flexible Electronics via Nano-Grating-Patterned Organic Photovoltaics", Nature, vol. 561, Sep. 27, 2018, 8 pages.
Sugiyama et al. "An Ultraflexible Organic Differential Amplifier for Recording Electrocardiograms", Nature Electronics, vol. 2, Aug. 2019, 12 pages.
Wie et al. "Wafer-Recyclable, Environment-Friendly Transfer Printing for Large-Scale Thin-Film Nanoelectronics", Jun. 22, 2018, 9 pages.
Yoo et al., "Efficient Perovskite Solar Cells via Improved Carrier Management", Nature, vol. 590, Feb. 24, 2021, 10 pages.
Zhou et al. "Fabrication of Silver Mesh/Grid and its Applications in Electronics", ACS Appl. Mater. Interfaces 2021, 13, 19 pages.

\* cited by examiner

TRANSFERABLE ULTRA-THIN SUBSTRATES AND RELATED TECHNIQUES

CROSS REFERENCE TO RELATED APPLICATION

This application claims the benefit of U.S. Provisional Application No. 63/252,974, filed on Oct. 6, 2021, which is hereby incorporated herein by reference in its entirety.

BACKGROUND

Ultra-thin photovoltaic (PV) devices can be prepared on premade substrates such as plastic films and metal foils, or on in-situ formed substrates such as chemical vapor deposited parylene or solution-processed polyimide. Owing to their extremely thin form and mechanical fragility, these devices are prepared on carrier substrates and may be delaminated upon completion of the device fabrication process. The presence of surface defects and thickness variation on premade ultra-thin substrates, along with challenges associated with handling such ultra-thin substrates prior to lamination onto a carrier have led to in-situ deposited substrates being more commonly used.

With the use of an additional encapsulation layer on top of a completed device, the overall geometries work out such that the functional components of the device can be located in a neutral plane, thereby limiting the mechanical-stress-damage to the device when flexed. Furthermore, device lamination onto pre-stretched elastomers allows for the formation of buckling structures which then show exceptional resilience under mechanical flexing and compression tests. In addition to PVs, there have been reports of a wide array of electronic and optoelectronic devices prepared in a similar fashion.

SUMMARY

According to aspects of the disclosure, a device is provided, comprising: a flexible carrier; a release layer that is formed on the flexible carrier; a releasable substrate formed over the release layer; and a semiconductor structure that is formed over the releasable substrate.

According to aspects of the disclosure, a method is provided, comprising: providing a flexible carrier; forming a release layer over the flexible carrier; forming a releasable substrate over the release layer; and forming a semiconductor structure over the releasable substrate to produce a transferable semiconductor device.

According to aspects of the disclosure, a device is provided, comprising: a permanent substrate; a transferable photovoltaic device that is laminated onto the permanent substrate, wherein the transferable photovoltaic device includes a transparent electrode layer, a first transport layer, an active layer, a second transport layer, and a back contact electrode layer that are formed on a releasable substrate; and wherein the transparent electrode layer, the first transport layer, the active layer, the second transport layer, and the back contact electrode layer are disposed between the releasable substrate and the permanent substrate.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1A:
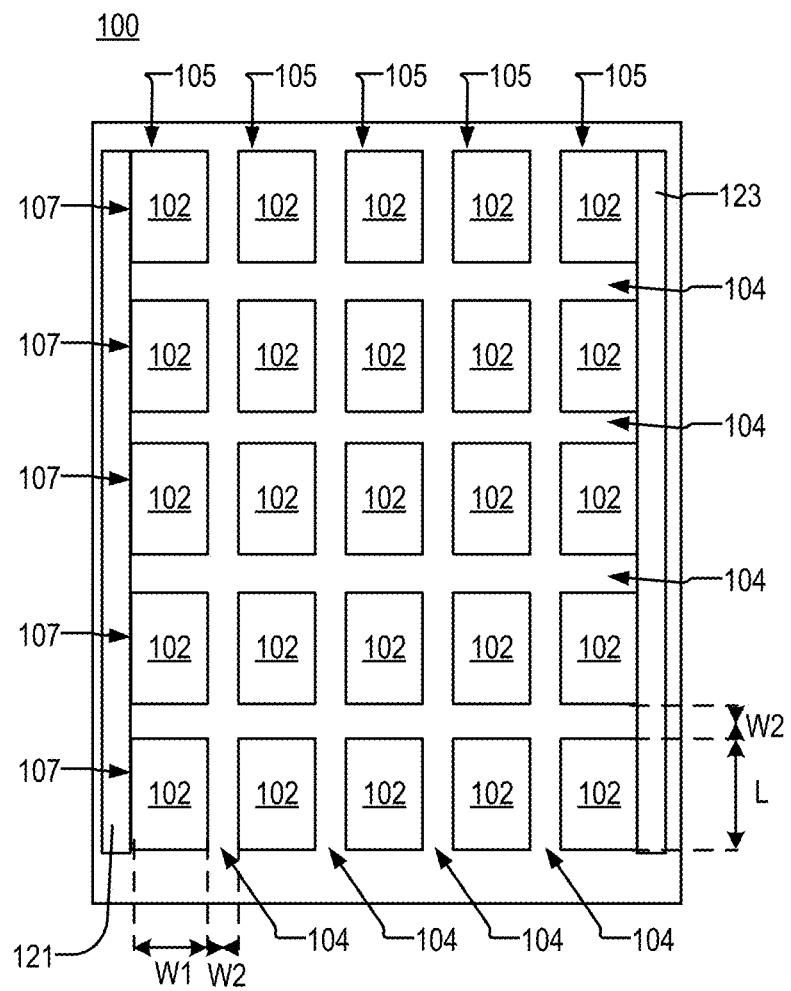
FIG. 1A is a top-down view of an example of a transferable device, according to aspects of the disclosure.

In accordance with the concepts, systems, devices and techniques described herein, it has been recognized that a next step in this field is to scale this technology to larger area devices using manufacturable processing techniques, including a fully-printed structure, thereby eliminating the need to transition back and forth between vacuum-based tools (to deposit electrodes) and solution processing tools for coating the charge transport and photoactive layers. These two needs are addressed by the concepts, systems, devices and techniques described herein.

Also described is transfer-lamination of such releasable photovoltaic modules onto fabrics. In embodiments, releasable PV modules may be transferred to lightweight, high-strength composite fabric which otherwise would not lend itself to direct integration into an organic photovoltaic (OPV) manufacturing process. Being able to prepare and transfer such PV modules, presents a path towards realizing solar as an additive power source to a large number of different types of surfaces around people including but not limited to fabrics. Thus, the concepts, systems, devices and techniques described herein pave the way towards the realization of various system-level demonstrations of active, lightweight, flexible surfaces.

Thus, described herein are concepts, systems, devices and techniques to prepare ultra-lightweight PV modules via scalable manufacturing techniques (including but not limited to slot-die coating and screen-printing). Also described is the integration of such devices (i.e., ultra-lightweight photovoltaic modules) into other surfaces via transfer lamination. With the concepts, systems, devices and techniques described herein printed solar modules on durable ultra-thin substrates may be disposed or otherwise integrated or added to other systems, circuits and/or devices for additive power (i.e., power from a sticker may be provided).

The ability to manufacture PVs at all scales, ranging from several microns to many square meters in area, enables the technology to find a place in a broad range of applications which may not be served by other modes of energy harvesting. Since PV devices and modules are stationary, quiet and capable of operating at room temperature, they present themselves as ideal integrated electrical power sources for use in emerging applications such as wearables, internet-of-thing (IOT) devices, and on-skin/in-tissue diagnostic tools.

Scalable manufacturing of ultra-thin devices via the concepts and techniques described herein enable such devices to power circuits, systems and devices which can carry out complex tasks such as computing, sensing, displaying information, and carrying out wireless communication, while maintaining a small footprint.

Coupling these benefits with the ability to process PVs on ultra-thin substrates (microns in thickness) allows thin-film solar to enable a paradigm in which any surface of choice can be electrified with the use of an additive photovoltaic device (e.g., much like a sticker) without noticeable addition in weight or topography. In particular, adding power without much weight increase is critical in certain applications such as electric cars, unmanned aerial vehicles (drones), and on-skin electronics, where excess weight may overshadow the benefits of additional power, and serves as the primary obstacle to the integration of already-available silicon PV alternatives.

More generally, it should be appreciated that the concepts, systems, devices and techniques described herein are not limited to use with photovoltaic devices. Rather, the concepts, systems, devices and techniques described herein may be used in conjunction with any type of electronic and/or optoelectronic device. Thus once a releasable substrate is deposited, any device including but not limited to a photovoltaic, a display (e.g. an OLED) a sensor, or a computing architecture (e.g., a flexible computer chips, that allow for on-skin computing) may be disposed on or otherwise formed or coupled to the releasable substrate.

In one aspect, described is a technique for manufacturing a releasable device from a flexible carrier. Such a technique allows for a manufacturable process, because the plastic flexible carrier is amenable for large-scale continuous manufacturing (e.g. roll-to-roll processing), as opposed to fabricating a device on a solid substrate (e.g., glass or silicon which require batch processing). It should be appreciated that the release does not necessarily need to occur before adhering. The release may occur, before, simultaneously, or after adhering to a fabric.

FIG. 1A is a schematic top-down view of a flexible photovoltaic (PV) device 100, according to aspects of the disclosure. As illustrated, the PV device 100 may include a plurality of cells 102 that are separated by interconnection regions 104. In addition, the PV device 100 may include terminals 121 and 123, which are configured to connect the PV device 100 to external circuitry. Each of the cells 102 may have a width W1 and a length L, and each of the interconnection regions 104 may have a width W2. According to the present disclosure, W1=10 mm, L=15 mm, and W2=3 mm. However, the present disclosure is not limited to any specific dimensions for the cells 102 or interconnection regions 104. Although in the present example the PV device 100 includes twenty-five cells, it will be understood that the present disclosure is not limited to the PV device 100 including any number of cells.

In some respects, the PV device 100 may be divided into stripes 105 and modules 107. In the example of FIG. 1A, a stripe 105 includes a column of cells 102 and an interconnection region 104 that is directly adjacent to the column. Furthermore, in the example of FIG. 1A, a module 107 includes a row of cells 102. As noted above, each stripe 105 may be 10 mm wide, with 3 mm for serial interconnection. In the example of FIG. 1A, each of the modules 107 includes 5 serially connected cells, each of size 1.5 $cm^2$, resulting in 7.5 $cm^2$ of active area per module. A cross-sectional side view of a module 107 is provided in FIG. 1E, which shows the interconnectivity between individual cells 102.

The PV device 100 may be manufactured in large sheets (e.g., 1×100 meters) which are subsequently rolled before they are shipped to a customer or put in storage. As is discussed further below, the PV device 100 may be formed on a flexible carrier. After the PV device 100 is manufactured, the carrier may be peeled off (or otherwise delaminated from the PV device 100) and the PV device 100 may be laminated over a permanent substrate. The permanent substrate may be a sheet of flexible material, such as fabric, or alternatively, the permanent substrate may be a panel of rigid or semi-rigid material. For example, in some implementations, the PV device 100 may be laminated over the roof of a tent, and used to provide power to people inside the tent. In another example, the PV device 100 may be laminated over a plastic base and used to form a solar panel this way.

Moreover, the PV device 100 is suitable for use in manufacturing settings in which the PV device 100 is both printed and laminated in the same manufacturing line. This is made possible by the PV device 100 being flexible and fully-capable of being rolled. An example of an integrated manufacturing line for the production and lamination of the PV device 100 is shown in FIG. 1H.

Figure 1B:
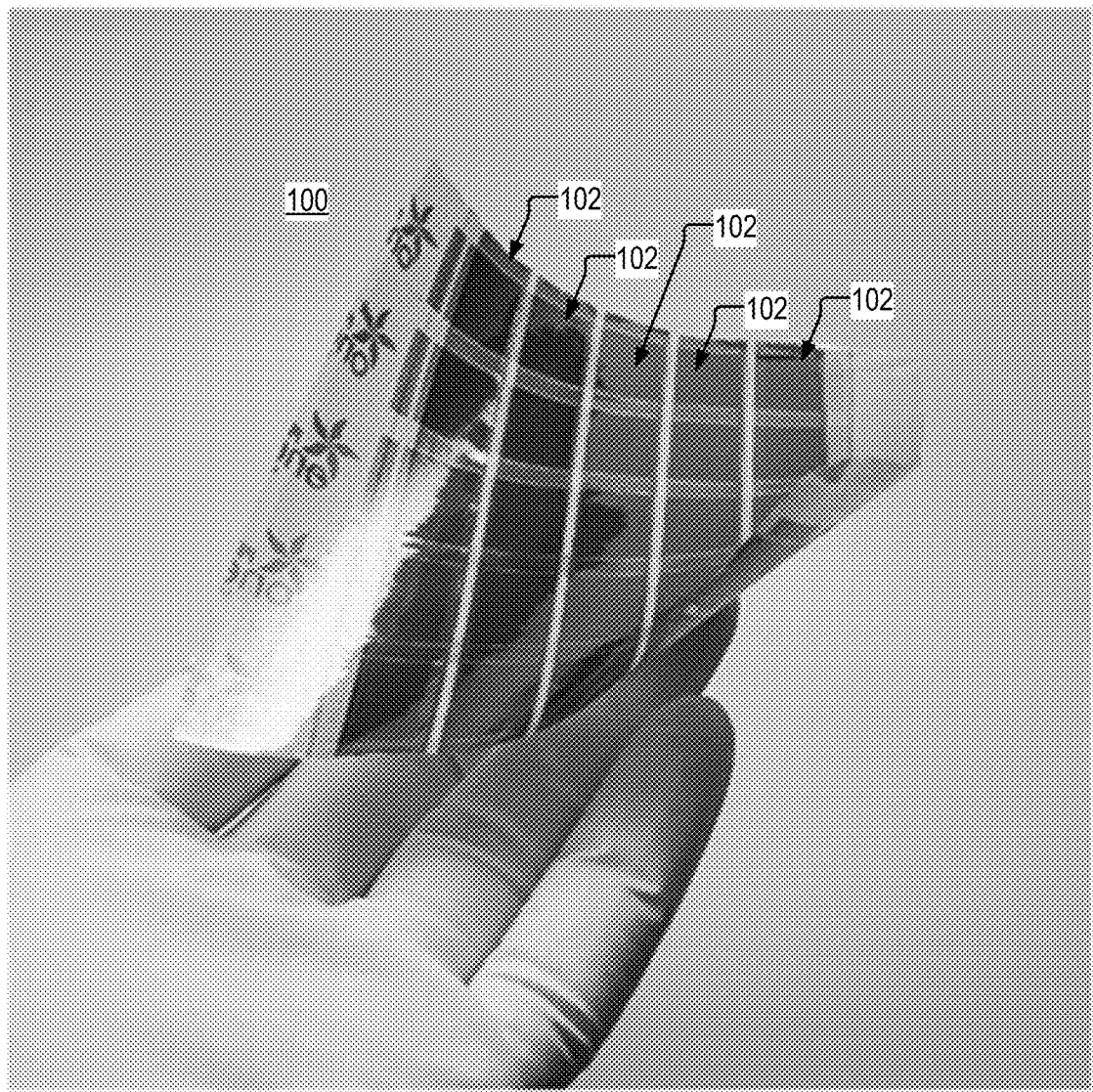
FIG. 1B is a photograph of the device of FIG. 1A, according to aspects of the disclosure.

FIG. 1B is a photograph of the PV device 100. FIG. 1B is provided to illustrate, that the PV device 100 can be flexible and thin. These characteristics make the PV device 100 especially suitable for mounting on fabric on roll-to-roll processing (e.g., see FIG. 1H). The suitability for roll-to-roll processing of the PV device 100 could make the PV device 100 less costly to manufacture and use at scale than similar rigid devices.

Figures 1C, 1D:
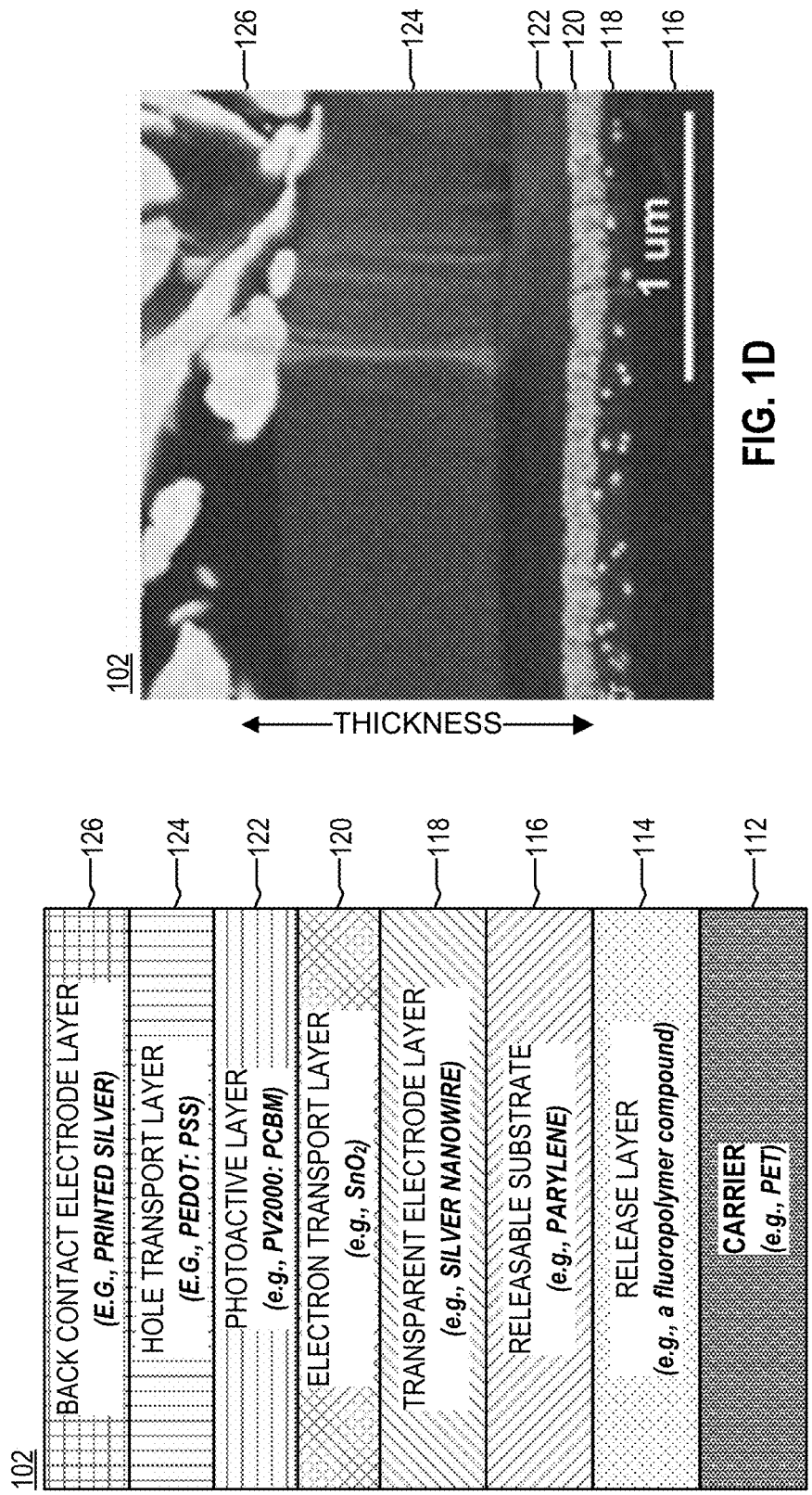
FIG. 1C is a cross-sectional side view of a cell that is part of the transferable device of FIG. 1A, according to aspects of the disclosure.
FIG. 1D is a micrograph of the cell of FIG. 1C, according to aspects of the disclosure.
Figure 1E:
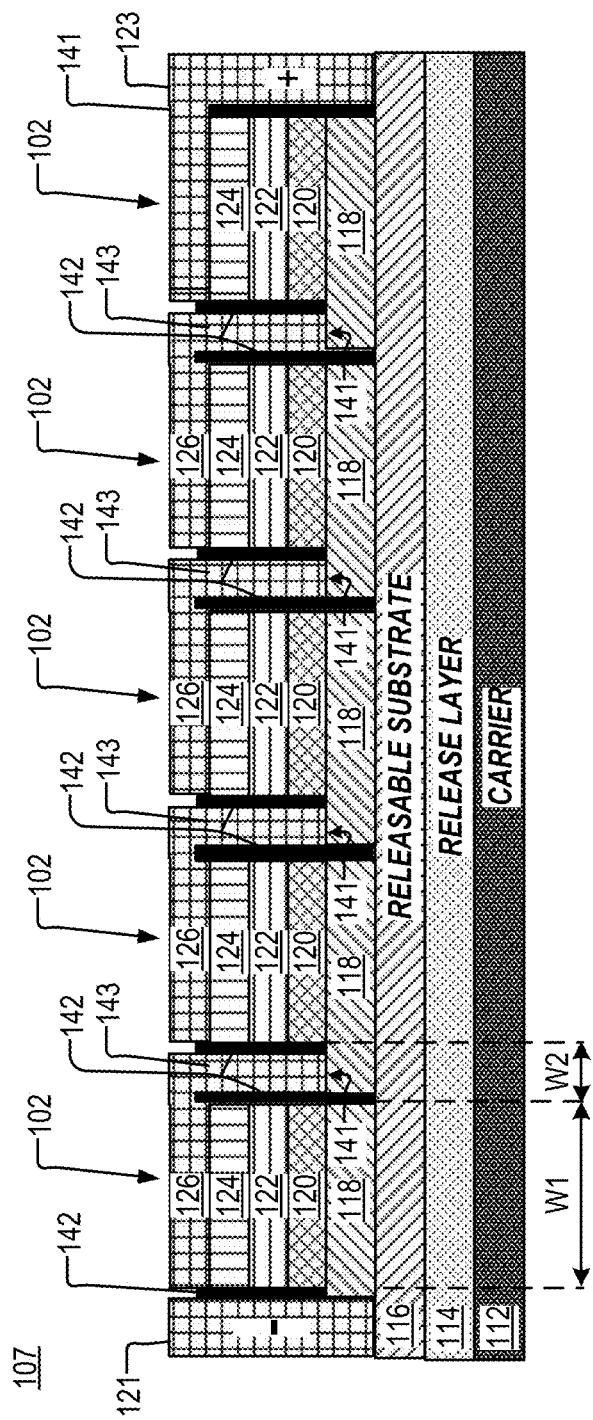
FIG. 1E is a cross-sectional side view of the transferable device of FIG. 1A, according to aspects of the disclosure.

FIGS. 1C-E show a cross-sectional view of the PV device 100, according to aspects of the disclosure. Specifically, FIG. 1C is a schematic cross-sectional side view of an individual cell 102 of the PV device 100. FIG. 1D is a micrograph of the individual cell 102. And FIG. 1E is a schematic cross-sectional side view of an entire module 107 of the PV device 100. FIG. 1C shows in greater detail examples of individual material layers that can be stacked to form the PV device 100, whereas FIG. 1E illustrates in greater detail the insulating layers and printed conductive interconnects between different cells 102 of the PV device 100. FIG. 1D is provided to illustrate the relative thicknesses of different material layers in the PV device 100, in accordance with one particular implementation.

As illustrated, the PV device 100 may include a flexible carrier 112, a release layer 114, a releasable substrate 116, a transparent electrode layer 118, an electron transport layer 120, a photoactive layer 122, a hole transport layer 124, and a back contact electrode layer 126.

The flexible carrier 112 may be arranged to provide structural support to the PV device 100 while the PV device 100 is manufactured, and before the PV device 100 is laminated onto a permanent base. In some implementations, the carrier 112 may include a polyethylene terephthalate (PET) sheet. Additionally or alternatively, in some implementations, the carrier 112 may include Melinex™ ST504 heat stabilized polyester film that is marketed and sold by Dupont Teijin Films of Chester, VA, USA. However, the present disclosure is not limited to using any specific material to implement the carrier 112. In some implementations, the carrier may have a root mean square (RMS) roughness of <5 nm. However, the present disclosure is not limited to any specific RMS roughness of the carrier 112. In some implementations, the carrier 112 may have a thickness in the range of 500-700 gauge, however the present disclosure is not limited to any specific thickness of the carrier 112. Although in the example of FIGS. 1C-E the carrier 112 is made of a flexible material, alternative implementations are possible in which the carrier 112 is made of rigid material.

The release layer 114 may be formed on the carrier 112. The release layer may be provided to facilitate clean delamination of the carrier 112 from the rest of PV device 100. In some implementations, the release layer 114 may be made of a material that is transparent, thermally and mechanically stable, and chemically resistant. Additionally or alternatively, in some implementations, the release layer 114 may have a thickness below 50 nm. The thickness uniformity of the release layer 114 should be sufficient to permit clean delamination of the releasable substrate 116 (and subsequent layers) from the carrier 112, as well as the formation of subsequent layers over the release layer 114. As used herein, the phrase "clean delamination" may refer to a delamination that does not stress the PV device 100 to the point at which the PV device 100 is damaged. In other words, the phrase "clean delamination" may refer to any delamination in which the PV device 100 is separated from the carrier 112 without being damaged. The ability to safely remove the PV device 100 from the carrier 112 may be important for using the PV device 100 in many commercial and industrial applications. Depending on the context, the term "PV device 100", as used throughout the disclosure, may refer to all layers in the stack shown in FIG. 1C or only layers 118-126 or layers (or only layers 116-126).

In some implementations, the release layer 114 may be formed of any suitable type of fluoropolymer material. In some implementations, the release layer 114 may be formed using a 1:3 mixture of 3M Novec 1700™ and 3M Novec 7100™. However, alternative implementations are possible in which the release layer is formed of Mirco90™ and/or any other suitable detergent. In some implementations, the release layer 114 may be blade-coated onto the carrier 112 with a blade gap of 500 microns and blade speed of 2 mm/s. However, the present disclosure is not limited to any specific method or material for forming the release layer 114.

Figure 5:
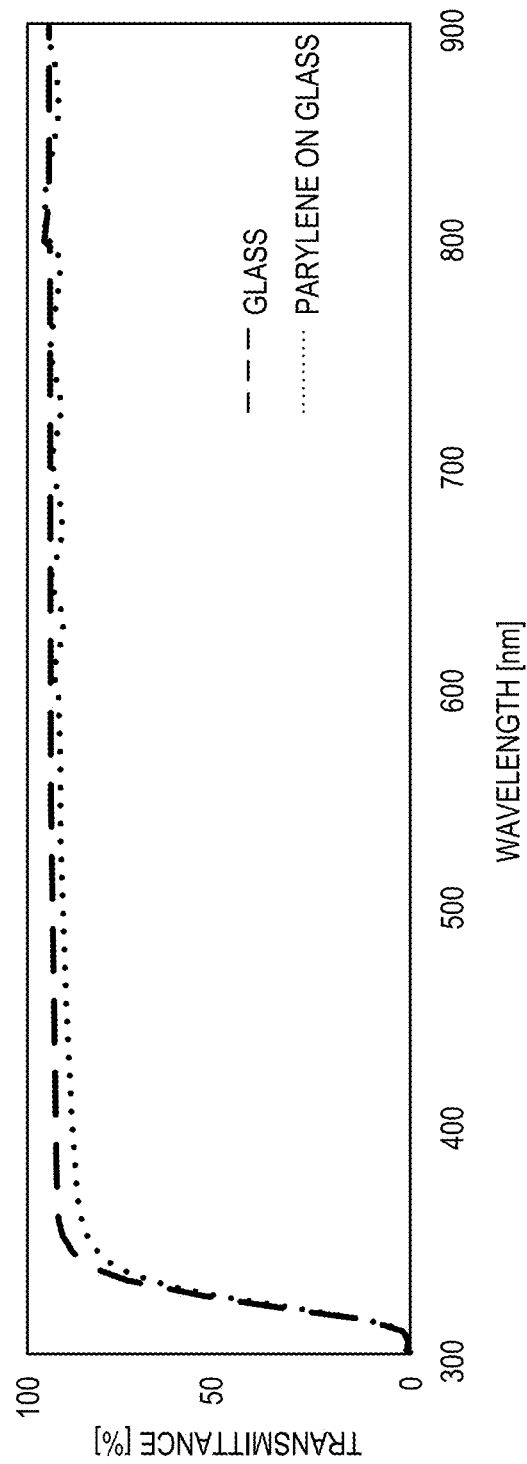
FIG. 5 shows a plot illustrating characteristics of a transferable device, according to aspects of the disclosure.

The releasable substrate 116 may be formed over the release layer 114. The releasable substrate 116 may be formed of any material that has sufficient flexibility and strength to permit the releasable substrate 116, and the layers 118-126, to be peeled (or otherwise delaminated) from the carrier 112. As illustrated in FIG. 1D, the thickness of a releasable substrate 116 may be less than 1 micron in some implementations. As noted above, FIG. 1D is a cropped-out image of an example of the PV device 100, which shows the cross-section of one particular cell 102 in the PV device 100. FIG. 1D shows the actual thickness of the layers that constitute the PV device 100, including the releasable substrate 116, in accordance with one particular implementation. In some implementations, the releasable substrate 116 may be formed of parylene (e.g., parylene-C, etc.). Additionally or alternatively, in some implementations, the releasable substrate 116 may be formed using chemical vapor deposition (e.g., Speedline Technologies™, PDS2010). Additionally or alternatively, in some implementations, the releasable substrate 116 may be formed by using solution (wet processing from a suitable soluble polymeric resin), coating and/or any other suitable technique. Stated succinctly, the present disclosure is not limited to any specific method or material for forming the releasable substrate 116. FIG. 5 shows a plot illustrating the optical transmittance spectra of bare glass and glass coated with parylene. FIG. 5 illustrates that parylene has a high-transmittance of wavelengths above 350 nm. Additionally or alternatively, in some implementations, the releasable substrate 116 may be 1-5 microns thick.

The transparent electrode layer 118 may be formed over the releasable substrate 116. In some implementations, the transparent electrode layer 118 may be formed by using silver nanowire (AgNW) ink (e.g., Heraeus™, Clevios HY E). Additionally or alternatively, in some implementations, the transparent electrode layer 118 may be formed by flood coating with a slot-die sheet-to-sheet coater, and drying the coated sheets in an oven at 125° C., for 5 minutes. It will be understood that the present disclosure is not limited to any specific method for making the transparent electrode layer 118. As is discussed further below, in some implementations, the transparent electrode layer 118 may be formed by using conducting PEDOT:PSS and by vacuum deposition (e.g., sputtering) of Indium tin oxide (ITO) or IMI (ITO-metal-ITO). Additionally or alternatively in some implementations, the transparent electrode layer 118 may be formed of a combination of PEDOT:PSS and silver nanowire ink.

Figure 2B:
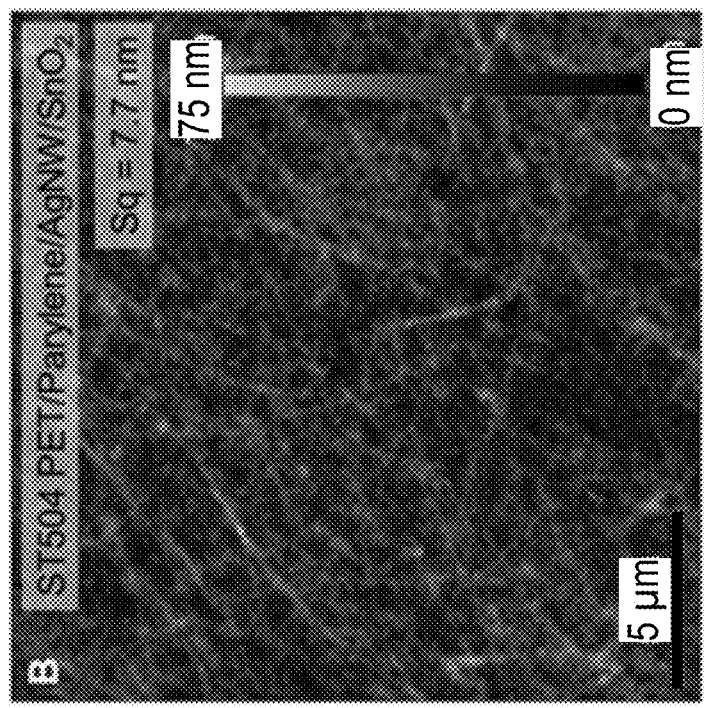
FIG. 2B is a micrograph of a material layer that is part of a transferable device, according to aspects of the disclosure.
Figure 2A:
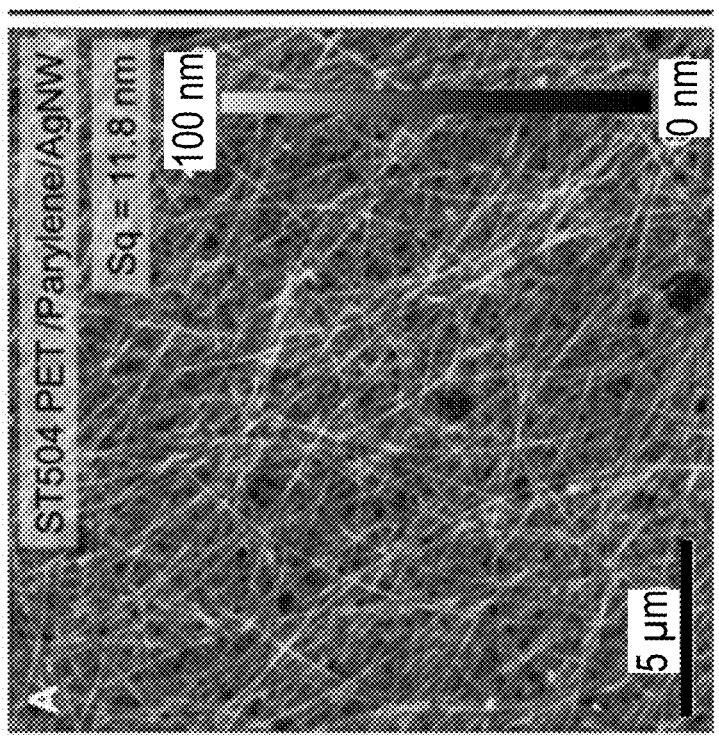
FIG. 2A is a micrograph of a material layer that is part of a transferable device, according to aspects of the disclosure.
Figure 2D:
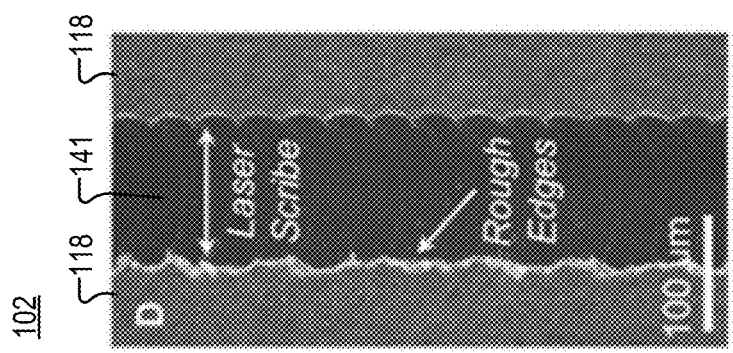
FIG. 2D is a micrograph illustrating an example of a scribe that is part of a transferable device, according to aspects of the disclosure.
Figure 2C:
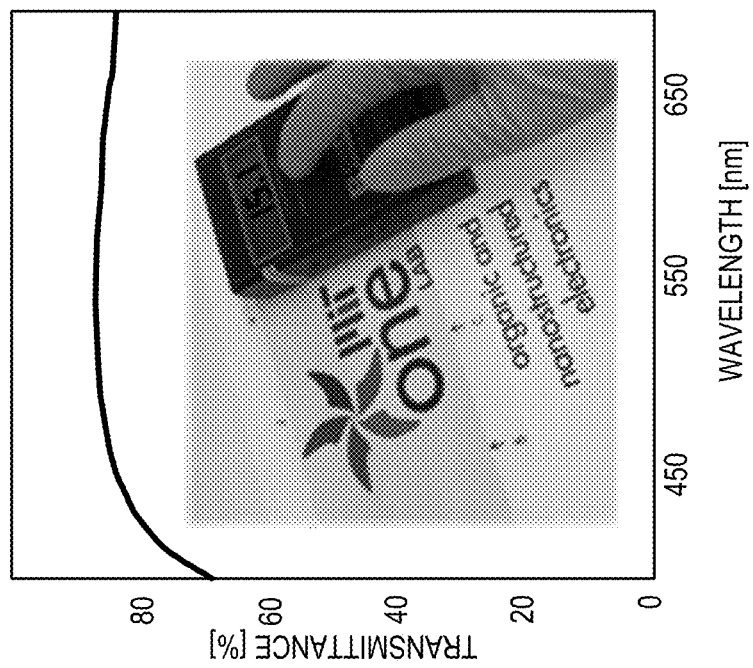
FIG. 2C shows a plot illustrating characteristics of a transferable device, according to aspects of the disclosure.

After the transparent electrode layer 118 is dried, the resulting structure may be laser-patterned using an infrared laser (e.g., Xiaming Laser Company™, XM-20D) to create scribes 141 (shown in FIG. 1E and FIG. 2C). Each of the scribes 141 may be covered with a slot-die coated insulator (e.g., Creative Materials™, 111-27) to form a pair dielectric layers 142. The dielectric layers 142 may limit yield losses due to edge defects from laser scribing, and may also define lanes within which subsequent layers (e.g., layers 120-124) would be slot-die coated. A respective conductive interconnect 143 may be formed between the dielectric layers 142 in each of the pairs of dielectric layers 142. The conductive interconnects 143 may be formed of the same material as the back contact electrode layer 126. In some implementations, both the back contact electrode layer 126 and the conductive interconnects 143 may be formed by screen-printing silver ink over the structure that results after the hole transport layer 124 is formed. As illustrated in FIG. 1E, the conductive interconnects may be used to form a serial electrical connection between the cells 102 in the module 107.

The electron transport layer 120 may be formed over the transparent electrode layer 118. In some implementations, the electron transport layer 120 may be formed by using tin-oxide and/or any other suitable type of material. Additionally or alternatively, in some implementations, the electron transport layer 120 may be formed by coating tin-oxide nanoparticles (e.g., Avantama, N-31) onto the transparent electrode layer 118 and drying the resulting structure in an oven at 120° C., for 3 minutes. It will be understood that the present disclosure is not limited to any specific method or material for forming the electron transport layer 120.

The photoactive layer 122 may be formed of with a blend of organic semiconducting compounds, in this case derivatives of poly(3-hexylthiophene) (e.g., Raynergy-Tek™, PV2000) and phenylbutyric acid methyl ester (PCBM). Specifically, a photoactive ink may be prepared by dissolving the blend PV2000:PCBM (14 mg/mL) in o-xylene, and stirring overnight at 85° C. Afterwards, the photoactive ink may be coated onto the electron transport layer 120 and dried in an oven at 120° C., for 3 minutes. However, it will be understood that the present disclosure is not limited to using any specific method or material to form the photoactive layer 122.

The hole transport layer 124 may be formed over the photoactive layer 122. The hole transport layer 124 may be formed by coating poly(3,4-ethylenedioxythiophene) polystyrene sulfonate (PEDOT:PSS) over the photoactive layer 122 and curing the resulting structure in an oven at 120° C., for 3 minutes. However, it will be understood that the present disclosure is not limited to using any specific method or material to form the hole transport layer 124. As can be readily appreciated, the positions of the hole transport layer 124 and the electron transport layer 120 may be interchanged in the stack shown in FIG. 1C.

The back contact electrode layer 126 may be formed by screen printing silver ink (Heraeus™, SOL530B) over the hole transport layer 124 and curing the resulting structure in an oven at 120° C., for 3 minutes. However, it will be understood that the present disclosure is not limited to using any specific method or material to form the back contact electrode layer 126.

FIGS. 1C-E are provided to illustrate an example of one possible semiconductor structure that can be formed over the stack including the carrier 112, the release layer 114, and the releasable substrate 116. In this regard, it will be understood that the present disclosure is not limited to any specific type of semiconductor structure being formed on the stack including the carrier 112, the release layer 114, and the releasable substrate 116. For example, in some implementations, an array of light-emitting diodes (e.g., LEDs) may be formed instead of the PV device 100. As noted above, forming any semiconductor structure on a stack including the carrier 112, the release layer 114, and the releasable substrate 116 permits the semiconductor structure to be later laminated on a flexible or rigid base.

Figure 1F:
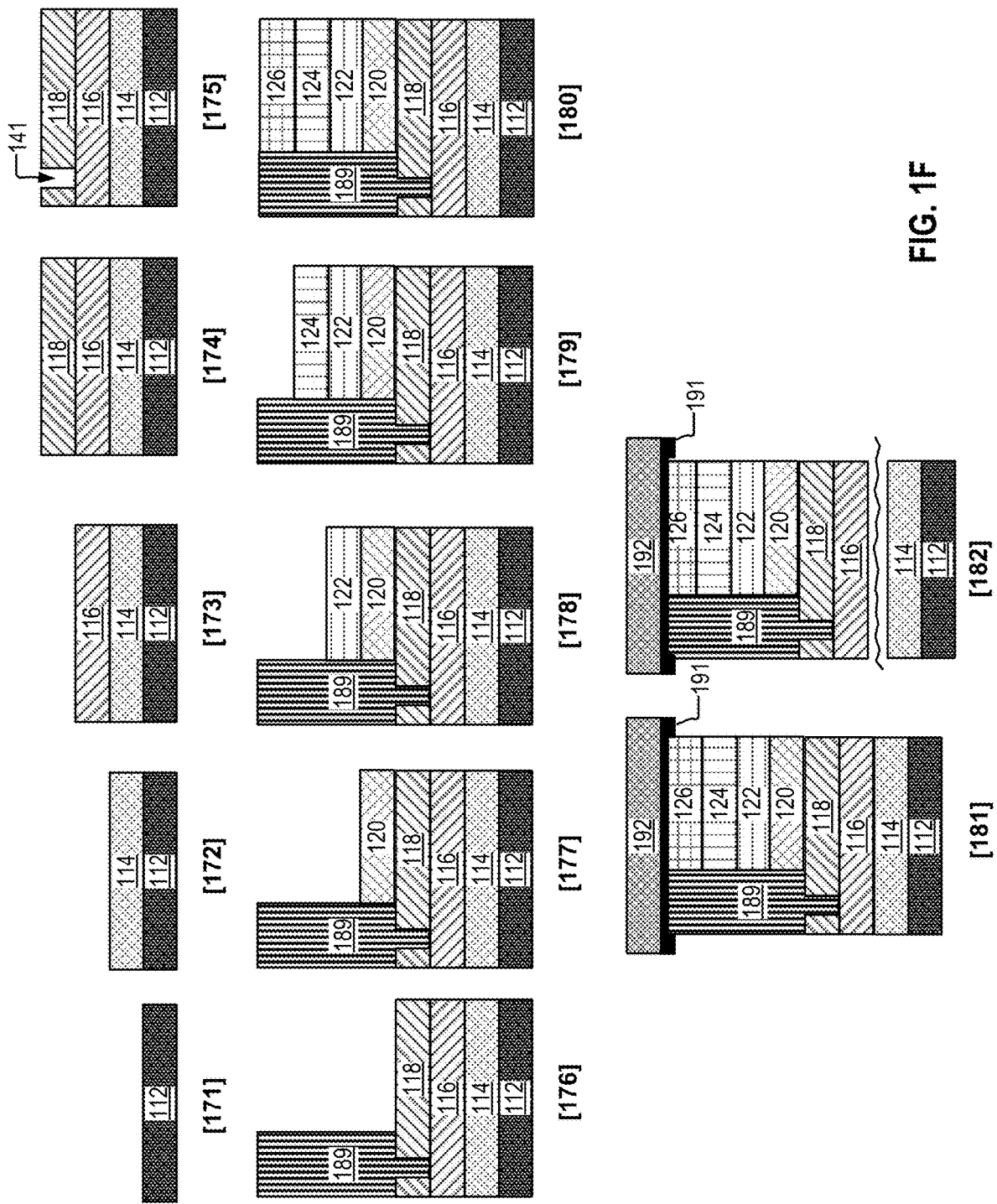
FIG. 1F is a schematic diagram illustrating an example of a process for making and using the transferable device of FIG. 1A, according to aspects of the disclosure.

FIG. 1F is a diagram of an example of a process for making and using the PV device 100, according to aspects of the disclosure. Although FIG. 1F shows the evolution of an individual cell 102 of the PV device 100 through different process stages, it will be understood that the process described with respect to FIG. 1F applies to the entire PV device 100.

At step 171, the carrier 112 is provided. At step 172, the release layer 114 is formed over the carrier 112. At step 173, the substrate 116 is formed over the release layer 114. At step 174, the transparent electrode layer 118 is formed over the substrate 116. At step 175, a scribe 141 is formed in the electrode layer 118. At step 176, a structure 189 is formed in the scribe 141 and over the electrode layer 118. As discussed above with respect to FIG. 1E, the structure 189 may be include a pair of dielectric layers 142. At step 177, the electron transport layer 120 is formed over the transparent electrode layer 118. At step 178, the photoactive layer 122 is formed over the electron transport layer 120. At step 179, the hole transport layer 124 is formed over the photoactive layer 122. At step 180, the back contact electrode layer 126 is formed over the hole transport layer 124. At step 181, the PV device 100 is laminated onto a permanent substrate 192 by using a layer of glue 191. The layer of glue 191 may include pressure-activated glue, light-activated glue, heat-activated glue, and/or any other suitable type of glue. At step 182, the carrier 112 and the release layer 114 are peeled off (or otherwise delaminated) from the PV device 100.

In some implementations, steps 181 and 182 may be performed as follows. Tin-coated copper bus bars (Adhesive Research, ARcare 90038) may be electrically coupled to the terminals 121 and 123 (shown in FIGS. 1A and 1E). The receiving substrate of interest, in the present example, Dyneema Composite Fabrics, may be laminated onto the PV device 100, with the use of a UV curable adhesive (DELO™, LP655) and a pouch laminator (Akiles, ProLam Ultra X6). The entire assembly may be exposed to UV radiation (Amergraph Corporation™, V28 VMS) for 2 minutes and then subsequently placed on a hotplate, set to 80° C., for 2 hours. Once annealed, all four sides may be trimmed, thereby creating a break in the removable substrate 116 which was attached to the PET carrier 112. Next, the PV device 100 may be delaminated off the PET carrier 112 simply by lifting the edge and rolling it off with a cylindrical rolling pin.

Figure 1G:
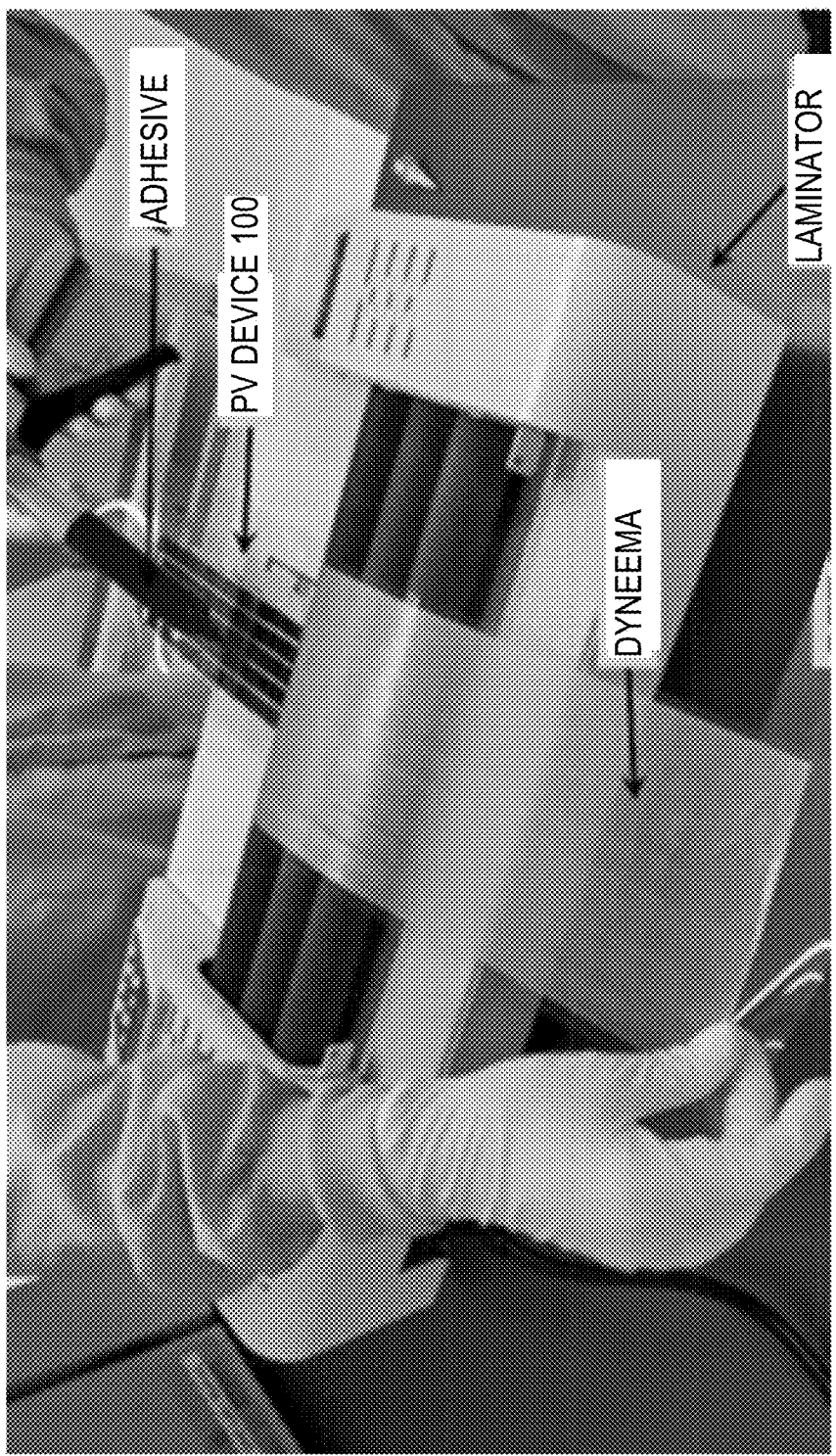
FIG. 1G is a photograph illustrating a process for using the transferrable device of FIG. 1A, according to aspects of the disclosure.
Figure 1H:
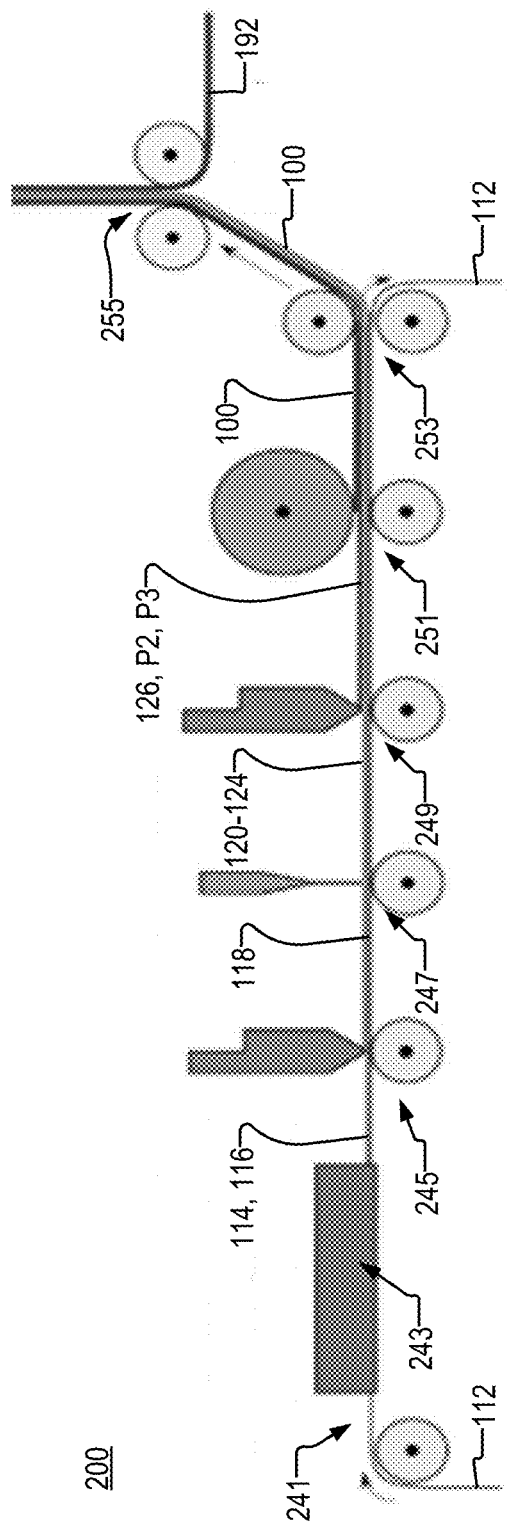
FIG. 1H is a schematic diagram illustrating an example of a process for making and using the transferable device of FIG. 1A, according to aspects of the disclosure.

FIG. 1G is a photograph of the PV device 100 being laminated onto Dyneema™ composite fabric. The Dyneema composite fabric and the PV device 100 are passed through a laminator with sufficient UV-activated adhesive dispensed in between the two. FIG. 1G is provided to illustrate a non-limiting example of the application the PV device 100 in a lab or small-scale setting.

FIG. 1H is a block diagram of a method for manufacturing and using the PV device 100 by using a roll-to-roll manufacturing line 200. At step 241, the carrier 112 is fed through the manufacturing line 200. At step 243, the release layer 114 and the releasable substrate 116 are formed on the carrier 112. As noted above, the release layer 114 may be formed by blade coating the carrier 112 with a fluoropolymer material and the releasable substrate 116 may be formed by using chemical vapor deposition to apply parylene-C over the release layer 114. At step 245, the transparent electrode layer 118 is formed on the releasable substrate 116. As noted above, the transparent electrode layer 118 may be formed by flood-coating the releasable substrate 116 with silver nanowire ink. At step 247, the resulting structure is laser-patterned to form the 141 scribes (shown in FIG. 1E). At step 249, the layers 120-124 are formed over the transparent electrode layer 118 (e.g., by using solution-coating techniques). At step 251, the dielectric layers 142 are formed, as well as the layers 126 and the conductive interconnects 143, thus completing the PV device 100. At step 253, the carrier 112 is delaminated from the PV device 100. At step 255, the PV device 100 is laminated onto a permanent substrate 192. According to the present disclosure, the permanent substrate 192 includes Dyneema composite fabric. However, the present disclosure is not limited to any specific type of material being used is a permanent substrate for the device 100. In some implementation, the PV device 100 may be printed in stripes by the manufacturing line 200. By virtue of being printed in stripes, the formation of layers 142 and 143 (see FIG. 1E) of the module 107 is built into the process, rather than requiring a subsequent laser/mechanical patterning step.

The Dyneema composite fabric, made of ultra-high molecular weight polyethylene fibers sandwiched between sheets of mylar, is one of the best materials commercially available for high-strength, low-weight applications. At 13 grams per square meter, and over 5 kN/m in tensile strength, the lightest offering of Dyneema composite fabric presents itself as a highly suitable receiving substrate of the ultra-thin solar devices. It lends significant mechanical support without adding much weight to the overall system. As noted above, in the example of FIG. 1G, the PV device 100 is transfer-laminated with the use of a UV curing adhesive (DELO LP655). Employing a pouch laminator, the two films are sandwiched with ample adhesive to ensure no dry spots and air bubbles are formed. Once UV cured, trimming the edges of the assembly creates a break between the releasable substrate 116 and the carrier 112, and allows for swift delamination of the carrier 112 from the assembly including the PV device 100 and the Dyneema composite fabric. Device testing before and after delamination shows comparable performance, as shown in FIGS. 4A-B.

Figure 4B:
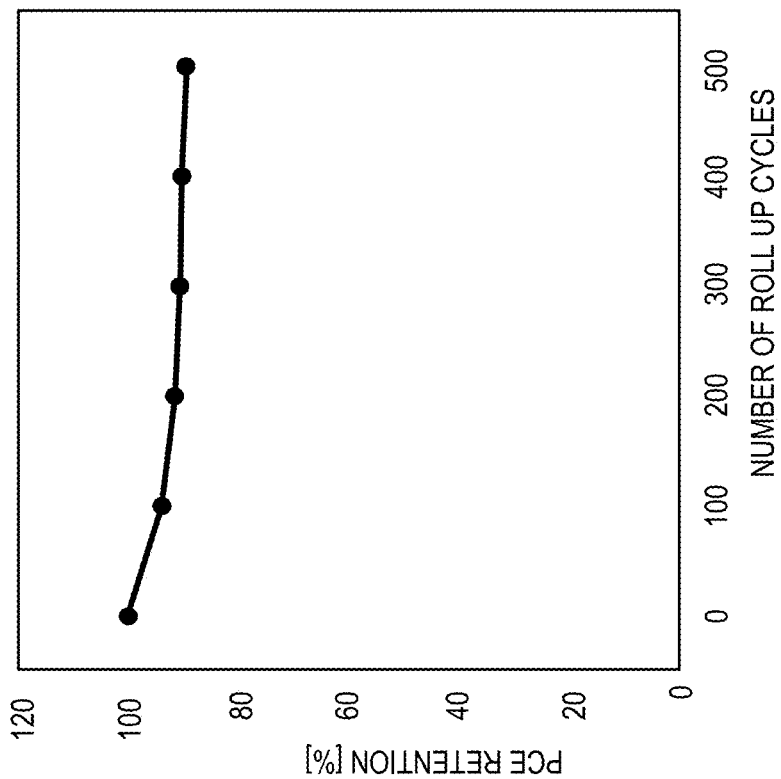
FIG. 4B shows a plot illustrating mechanical characteristics of a transferable device, according to aspects of the disclosure.
Figure 4A:
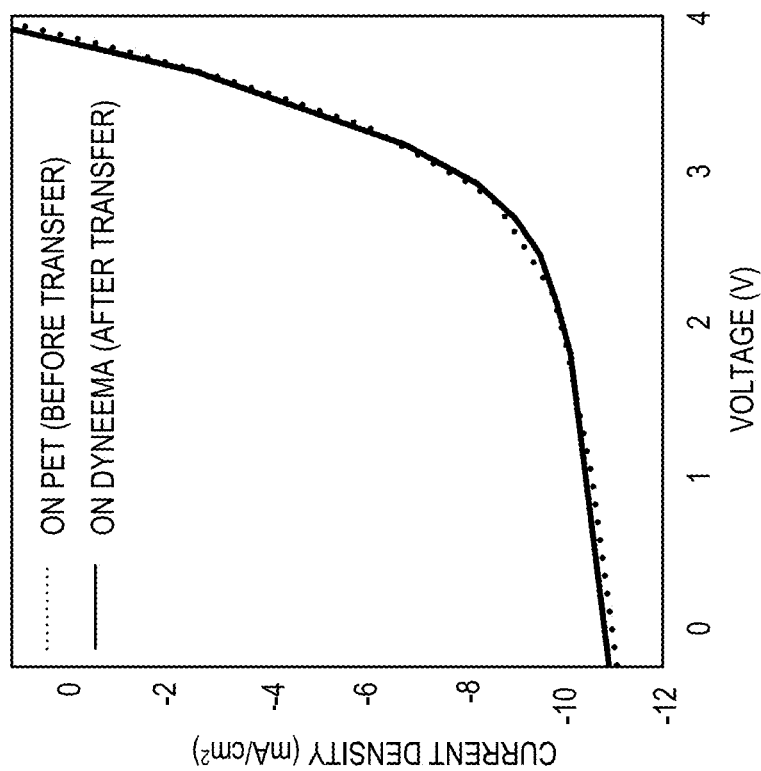
FIG. 4A shows a plot illustrating characteristics of a transferable device, according to aspects of the disclosure.

Roll-up testing of transferred devices, with the use of an optical post (radius=¼", 6.4 mm) shows resilience, retaining 90% of the initial power conversion efficiency, averaged across five modules on a sheet, after 500 cycles of rolling, as summarized with respect to FIG. 4B. In particular, it is expected that such lightweight composite fabrics with power generating capability may be directly used in manufacturing of items such as tents, tarps and sails or being used as a laminate on the wings of drones and the roofs of cars.

In one example, the power of an integrated fabric-PV modules may be 370 W/kg, weighing 105 g/m$^2$, while comparable free-standing PV devices are expected to have a specific power of 730 W/kg, and weight of 52 g/m$^2$. The specific power can be further increased by reducing the mass of the printed top electrode, which currently serves as the predominant source of weight in the device structure itself, at approximately 10 microns in thickness, as observed in the cross-section electron micrograph shown in FIG. 1D. Weight reduction of the printed top electrode can be achieved through the use of a silver grid or silver nanowire coatings. Though free-standing PVs made on ultra-thin substrates naturally have substantially higher specific powers, their fragility makes it impractical to realize such a technology at scale. The use of a flexible carrier presents a pathway in which such ultra-thin devices can be donated onto receiving surfaces without damage from handling, allowing for retention of such high specific powers. Alternatively, integration of these devices onto light-weight and high strength materials, such as the Dyneema Composite Fabric, also presents significant practical advantages in transportation and installation of these photovoltaics where high capacities are required.

In the example of FIG. 1H, vapor-deposited parylene is employed as the in-situ formed releasable substrate 116. Chemical vapor deposition is a relatively slow deposition technique in comparison to the solution-coating techniques employed to fabricate the remaining layers of the device. For this reason, it will be understood that the present disclosure is not limited to using chemical vapor deposition to form the releasable substrate 116. For example, in some implementations, the release layer 114 may be solution-coated with with other soluble resins (polyester, for example) to form the releasable substrate 116.

In some instances, important to fully realize the potential of the techniques described with respect to FIGS. 1A-H may be the availability of equally ultra-lightweight encapsulation barriers that can protect the active layers of fabric-PVs from atmospheric exposure, which in turn can extend the operational lifetime of these devices, as needed for real-world applications. Currently available packaging films would significantly increase the weight of these structures and limit the value of developing these ultra-lightweight device form factors. Likewise, translation of higher efficiency active material sets such as thin-films of perovskites or of recently reported non-fullerene-based organic systems can further expand the domain of applications that can be addressed with this technology. Moreover, systems-level integration of devices (such as the PV device 100) with power-electronic circuits, and storage elements could be important for the technology to transition from lab-based demonstrations to consumer-ready technology.

Figure 1I:
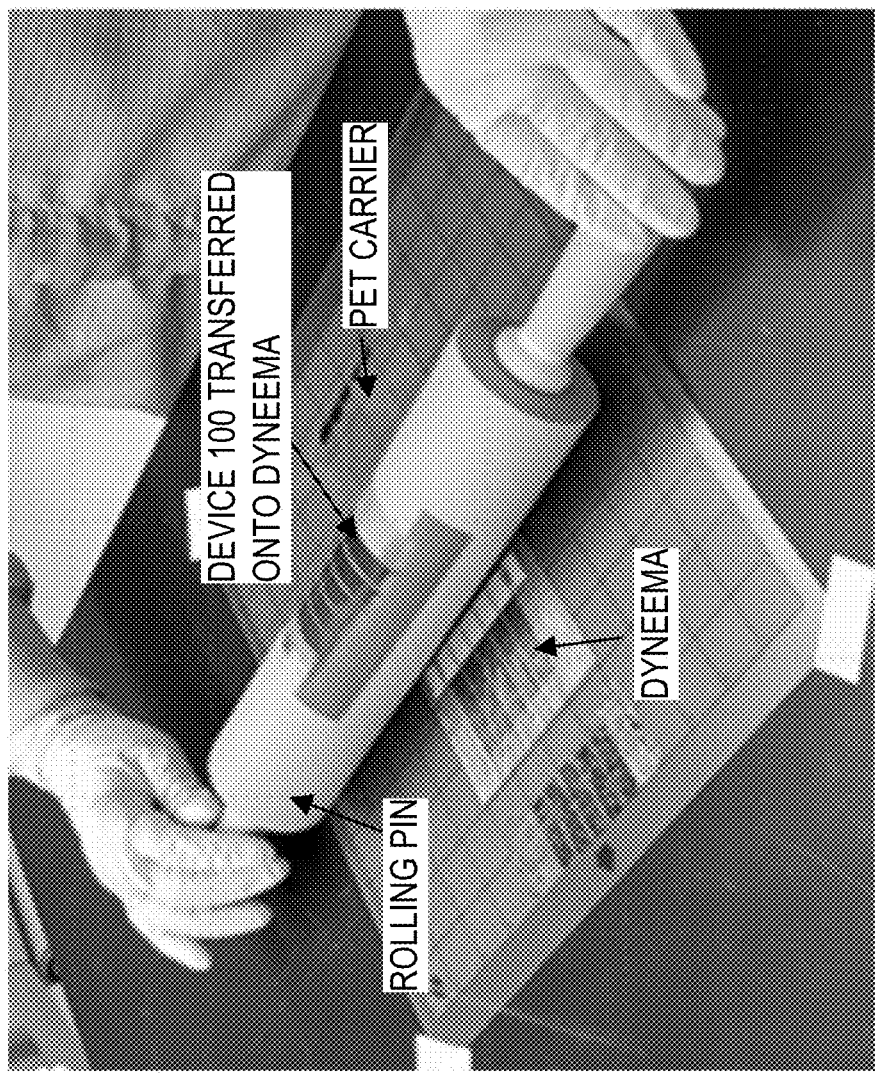
FIG. 1I is a photograph illustrating a process for using the transferrable device of FIG. 1A, according to aspects of the disclosure.

FIG. 1I illustrates a delamination of the device 100 from the carrier 112 onto the Dyneema fabric after UV exposure. An adhesive mat is used to stabilize the carrier 112 while the device 100 is delaminated with a rolling pin. FIG. 1I is provided to illustrate a non-limiting example the application of the the PV device 100 in a lab or small-scale setting.

Figure 1J:
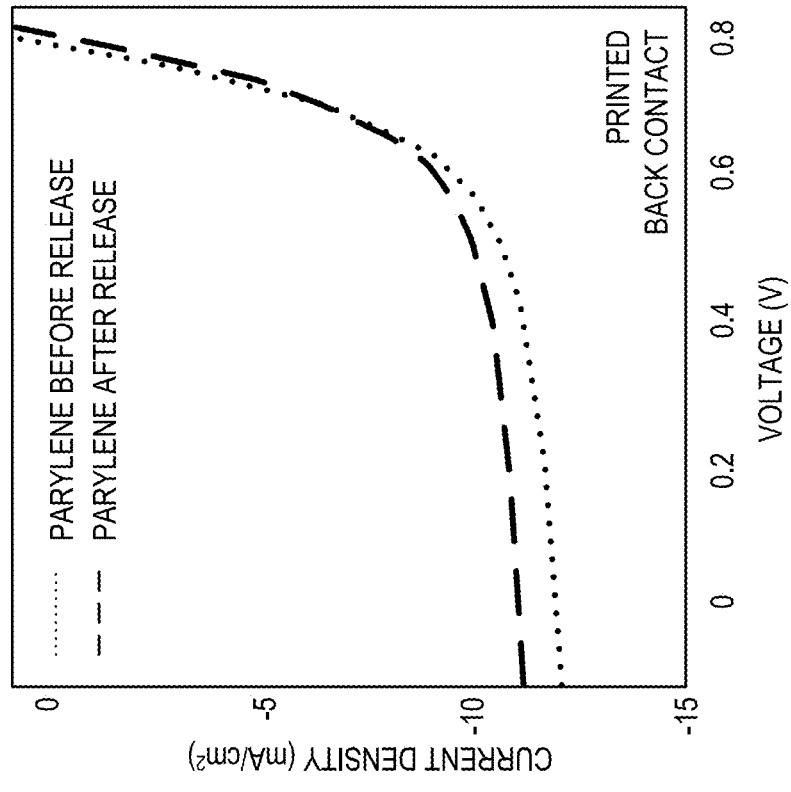
FIG. 1J shows plots illustrating characteristics of a transferable device, according to aspects of the disclosure.
Figure 1J:
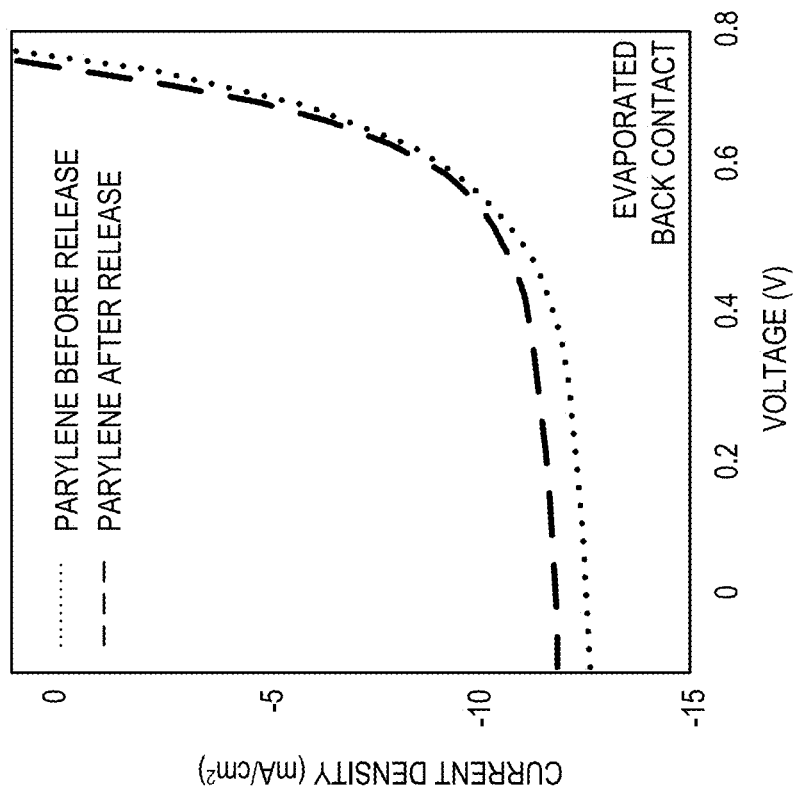

FIG. 1J shows plots 272 and 274. Plots 272 and 274, as well as Table 1 below, evaluate process feasibility of a small-scale device. Plot 272 shows current voltage characteristics of on-glass and on-parylene devices with evaporated top-electrode, used as controls. Plot 274 shows current voltage characteristics of on-glass and on-parylene devices with printed top-electrode. Plots 272 and 274 show the current voltage properties of parylene devices before and after the release of the devices from the carrier, and illustrate that the delamination of the carrier does not degrade device performance. Further properties of the devices are illustrated in Table 1 below. The properties include open circuit voltage (Voc), short-circuit current density (Jsc), fill factor (FF), and power conversion efficiency (PCE).

TABLE 1

| | Evaporated Top Electrode | | Printed Top Electrode | |
|---|---|---|---|---|
| | Before Release | After Release | Before Release | After Release |
| Voc [V] | 0.77 | 0.75 | 0.75 | 0.76 |
| Jsc [mA/cm$^2$] | 12.6 | 11.9 | 12 | 11.1 |
| FF [%] | 59.9 | 62.5 | 61.6 | 61.6 |
| PCE [%] | 5.8 | 5.6 | 5.5 | 5.2 |

FIGS. 2A and 2B show the surface roughness of materials that can be used to form different layers of the PV device 100, according to one particular implementation. FIG. 2A is an atomic force micrograph of silver nanowires slot-die coated onto parylene-covered PET sheets, showing an RMS roughness of 11.8 nm. FIG. 2B shows an atomic force micrograph of tin-oxide nanoparticles slot-die coated over the nanowires, showing a reduced RMS roughness of 7.7 nm. Scan dimensions of both images are 20 µm×20 µm. FIG. 2D is a micrograph of the laser scribe 141, which is discussed above with respect to FIG. 1E. FIG. 2D shows edge defects in the transparent electrode layer 118 that result when the scribe 141 is formed, and the subsequent sealing of the scribe-line with a slot-die coated dielectric to form the dielectric layers 142.

Figure 3:
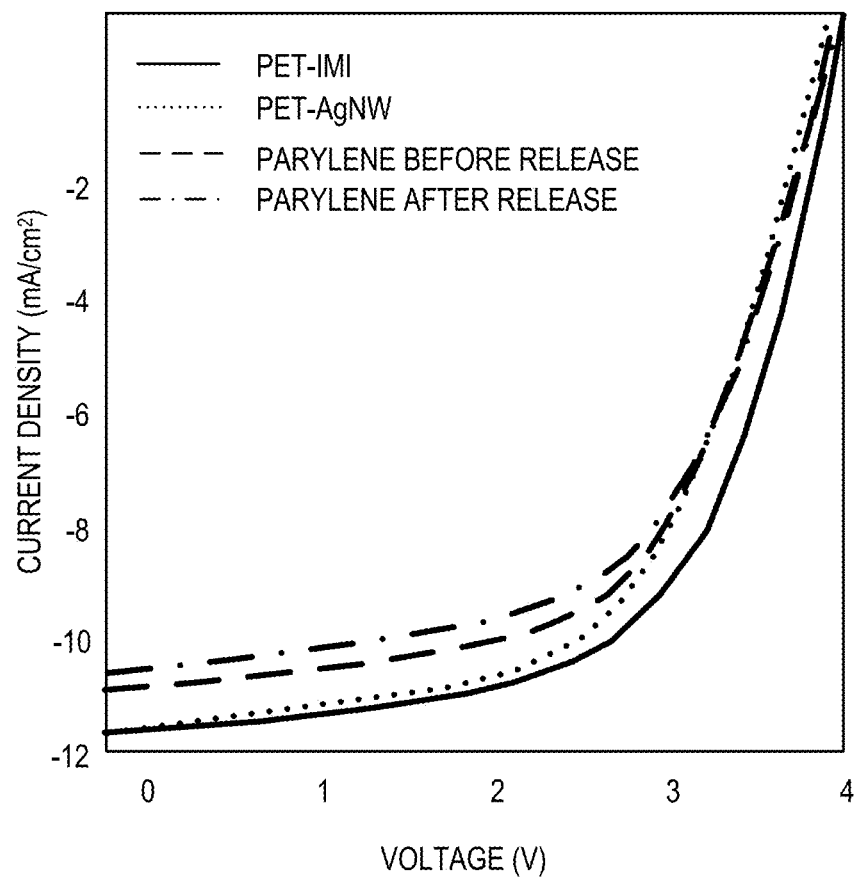
FIG. 3 shows a plot illustrating electrical characteristics of a transferable device, according to aspects of the disclosure.

FIG. 3 is a plot showing current-voltage properties of control devices and parylene on PET devices before and after release from the PET carrier. The control devices include an ITO-metal-ITO (IMI) on PET device and a silver nanowire (AgNW) on PET device. Table 2 below shows additional properties of the control devices and the Parylene-on-PET devices.

TABLE 2

|  | PET-IMI | PET-NW | Parylene Before Release | Parylene After Release |
|---|---|---|---|---|
| Voc [V] | 3.93 | 3.84 | 3.86 | 3.89 |
| Jsc [mA/cm$^2$] | 11.5 | 11.5 | 10.8 | 10.5 |
| FF [%] | 59.7 | 57 | 58.3 | 57.3 |
| PCE [%] | 5.4 | 2.1 | 4.9 | 4.7 |

FIG. 4A is a plot illustrating current-voltage properties of a parylene-on-PET device before the device is transferred from its PET carrier, and after the device is transferred onto a Dyneema composite fabric. FIG. 4B is a plot illustrating the relative change in power conversion of the parylene-on-PET device as a function of roll-up cycles around an optical post (radius=¼", 6.4 mm). Table 3 below shows additional properties of the parylene-on-PET device.

TABLE 3

|  | Device on PET | Device on Dyneema |
|---|---|---|
| Voc [V] | 3.85 | 3.88 |
| Jsc [mA/cm$^2$] | 10.8 | 10.9 |
| FF [%] | 58.2 | 56.1 |
| PCE [%] | 4.85 | 4.77 |

Table 4 below provides a summary of the performance of the design of FIGS. 1A-J. Table 4 compares the performance of five printed devices, each containing five modules. Each module comprised of five cells, each with an active area of 1.5 cm$^2$, connected in series for a total active area of 7.5 cm$^2$. Coating multiple modules on a single sheet, rather than printing one large module per sheet allows one to evaluate coating quality and process repeatability across the sheet. Based on the average and standard deviation across the five modules per sheet, it is possible to infer that the process discussed above with respect to FIGS. 1A-J is stable and repeatable. In one aspect, Table 4 shows that the processes and designs described throughout the disclosure provide consistent performance, which can be repeatedly achieved over a large area.

TABLE 2

|  | Module A | Module B | Module C | Module D | Module E | Avg. | Standard Deviation |
|---|---|---|---|---|---|---|---|
| Control-Commercial IMI Substrate | | | | | | | |
| Voc [V] | 3.93 | 3.93 | 3.93 | 3.94 | 3.93 | 0.0 | |
| Jsc [mA/cm$^2$] | 10.74 | 11.01 | 11.09 | 11.55 | 11.70 | 1.22 | 0.36 |
| FF [%] | 62.97 | 61.60 | 60.62 | 59.67 | 57.52 | 0.48 | 1.84 |
| PCE [%] | 5.31 | 5.33 | 5.29 | 5.41 | 5.30 | 5.33 | 0.05 |
| Control-Nanowire Substrate | | | | | | | |
| Voc [V] | 2.59 | 3.82 | 3.83 | 3.83 | 3.84 | 3.58 | 0.50 |
| Jsc [mA/cm$^2$] | 11.13 | 11.38 | 11.39 | 11.45 | 11.54 | 1.38 | 0.14 |
| FF [%] | 45.48 | 57.33 | 58.39 | 57.53 | 57.08 | 5.16 | 4.86 |
| PCE [%] | 2.62 | 4.99 | 5.09 | 5.04 | 5.06 | 4.56 | 0.97 |
| Freestanding Device-Before Release (On PET Carrier) | | | | | | | |
| Voc [V] | 3.86 | 3.85 | 3.84 | 3.69 | 3.89 | 3.82 | 0.009 |
| Jsc [mA/cm$^2$] | 10.84 | 10.47 | 10.20 | 10.25 | 10.20 | 0.39 | 0.24 |
| FF [%] | 58.27 | 59.39 | 58.23 | 50.69 | 56.67 | 6.65 | 3.10 |
| PCE [%] | 4.87 | 4.78 | 4.57 | 3.83 | 4.49 | 4.51 | 0.36 |
| Freestanding Device-After Release | | | | | | | |
| Voc [V] | 3.89 | 3.87 | 3.86 | 3.64 | 3.85 | 3.82 | 0.09 |
| Jsc [mA/cm$^2$] | 10.52 | 10.00 | 9.93 | 10.06 | 9.99 | 0.10 | 0.21 |
| FF [%] | 57.30 | 56.91 | 56.57 | 50.02 | 53.61 | 4.88 | 2.76 |
| PCE [%] | 4.69 | 4.41 | 4.34 | 3.66 | 4.12 | 4.24 | 0.34 |
| Fabric Device-Before Release (On PET Carrier) | | | | | | | |
| Voc [V] | 3.90 | 3.86 | 3.89 | 3.85 | 3.89 | 3.88 | 0.02 |
| Jsc [mA/cm$^2$] | 10.51 | 10.30 | 10.46 | 10.84 | 11.27 | 0.68 | 0.34 |
| FF [%] | 57.77 | 57.58 | 56.96 | 58.19 | 56.25 | 7.35 | 0.68 |
| PCE [%] | 4.73 | 4.58 | 4.63 | 4.86 | 4.93 | 3.75 | 0.13 |
| Fabric Device-After Release (on Dyneema Composite Fabric) | | | | | | | |
| Voc [V] | 3.55 | 3.87 | 3.87 | 3.88 | 3.87 | 3.81 | 0.13 |
| Jsc [mA/cm$^2$] | 10.51 | 10.45 | 10.56 | 10.95 | 11.45 | 0.79 | 0.38 |
| FF [%] | 50.28 | 55.29 | 54.69 | 56.12 | 55.16 | 4.37 | 2.10 |
| PCE [%] | 3.75 | 4.50 | 4.48 | 4.77 | 4.88 | 4.48 | 0.40 |

Table 4 includes six sections. The first section is labeled "Control—Commercial IMI substrate" and it lists the characteristics of a first control device that is formed on a commercial IMI substrate. The first control device may lack a carrier, a releasable carrier, and a release layer, but it may be otherwise the same or similar to the PV device 100 (i.e., it may have the same contact, transport, and active layers, as well as the same electrode layers). The second section is labeled "Control—Nanowire Substrate" and it lists the characteristics of a second control device that is formed on a nanowire substrate. The control device may lack carrier and release layers, but it may be otherwise the same or similar to the PV device 100 (i.e., it may have the same contact, transport, and active layers, as well as the same electrode layers). The third section is labeled "Freestanding Device—Before Release (On PET Carrier)". The third section lists the characteristics of a first test device before the first test device is removed from the PET carrier. The first test device may be the same as the PV device 100. The fourth section is labeled "Freestanding Device—After Release". The fourth section lists the characteristics of the first test device after the first test device is removed from the PET carrier, but before the first test device is laminated onto a permanent substrate. The fifth section is labeled "Fabric Device—Before Release (On PET Carrier). The fifth section lists the characteristics of a second test device before the second test device is removed from the PET carrier. The second test device may be the same as the PV device 100. The sixth section is labeled "Fabric Device—After Release". The sixth section lists the characteristics of the second test device after the second device is removed from the PET carrier and laminated onto a sheet of Dyneema fabric.

The discussion that follows presents further aspects of PV devices, such as the PV device 100, as well as further aspects of processes for making and using the PV devices.

A. Process for Preparing the Release Layer, Releasable Substrate, and Transparent Electrode Layer of a PV Device This section describes aspects of the preparation of the release layer, the releasable substrate, and the transparent electrode layer of a PV device, such as the PV device 100. Though glass has been the carrier material of choice in literature for preparing such ultra-thin devices, it does not readily lend itself to integration into large-area coating techniques such as slot-die coating and screen printing. Owing to the brittle nature of glass and its inability to be slit and trimmed with ease, the present disclosure instead uses polyethylene terephthalate (PET) sheets. In particular, according to the present disclosure, heat-stabilized PET without any adhesion promoting coatings was selected for use as a carrier (such as the carrier 112 shown in FIGS. 1C-E) to allow for ultra-smooth surfaces to fabricate devices on, and subsequent facile delamination of the devices once completed.

Once slit and trimmed to the desired dimensions, a fluoropolymer release layer may be blade-coated onto PET substrates to form a release layer, such as the release layer 114 (shown in FIGS. 1C-E). This may be followed by parylene thin film deposition onto the substrates via chemical vapor deposition to form a releasable substrate, such as the releasable substrate 116 (shown in FIGS. 1C-E). It is noted that when inside the parylene deposition chamber PET substrates may be enclosed in a sample carrier formed of a wire mesh, which eliminates the inadvertent deposition of parylene dimer particulates that could leave the evaporative cell during the pressure change of the tool pump-down cycle. Often, such deposition issues do not significantly affect the performance of individual devices owing to the small active areas of lab-test structures, however, these particulates can be a source of shunt pathways in larger area modules, which are contemplated by the present disclosure.

In the scaled production of this lightweight PV technology, the deposition of the releasable substrate and the sputtered insulator-metal-insulator (IMI) can be decoupled from the remaining fabrication processes, so that pre-made rolls of the substrate can be loaded into the coating stations for further addition of remaining layers. It will be recalled that IMI can be used to implement the transparent electrode layer of a PV device, such as the PV device 100. In other words, the pre-made rolls may include a carrier, a release layer formed over the carrier, a releasable substrate formed over the carrier, and a transparent electrode layer, but they may lack active or transport layers, as well as a back contact electrode layer. In some implementations, each layer in a PV device (such as the PV device 100) may be produced by solution-coating or printing, thereby significantly simplifying the manufacturing process, and in-turn reducing the cost of the end product.

Coatable alternatives to IMI for a transparent electrode include highly conducting poly(3,4-ethylenedioxythiophene) polystyrene sulfonate (PEDOT:PSS), silver nanowires (AgNW), and screen-printed silver meshes. As discussed above, the example of FIGS. 1A-E uses silver nanowire ink. However, alternative implementations are possible in which the transparent electrode layer 118 is formed of PEDOT:PSS or a combination of PEDOT:PSS and silver nanowire ink. The ink is flood coated onto the substrate with the use of a slot-die sheet-to-sheet coater. In one aspect, optimized coating conditions lead to transparent (~85% transmittance) and conductive (15-17 Ω/sq) electrodes, as observed in FIG. 2C. In another aspect, use of the PEDOT:PSS matrix leads to (1) reduced surface roughness, as compared to films of nanowires coated without any filler; and (2) isotropic sheet resistance which may otherwise be affected by selective orientation of nanowires during the coating process. According to the present disclosure, several points on multiple coated sheets were measured, both in the coating and transverse directions, and the calculated average of sheet resistances in the respective directions were 16.4 Ω/sq and 17.4 Ω/sq demonstrating the conductance isotropy.

Once formed, the transparent electrode may be patterned with an infrared laser to create scribes, such as the 141 scribes which are discussed above with respect to FIGS. 1E and 2D. As discussed above, in the example of FIGS. 1A-E, scribes are spaced 13 mm apart with the intention of creating modules with 10 mm wide cells and 3 mm wide interconnects. A schematic of the module geometry is discussed above with respect to FIG. 1E. Laser ablation of the silver nanowire films often result in edge defects, as seen in FIG. 2D, which pose a risk to electrical shorts in the device and can limit overall yields in a scaled manufacturing process. To prevent such issues, the scribes may be encapsulated with a slot-die coated insulator, which also defines the lanes in which subsequent layers (e.g., the conductive interconnect 143) are to be coated in.

B. Process for Preparing the Electron Transport Layer, the Hole Transport Layer, the Active Layer, and the Top Electrode of a PV Device This section describes aspects of the preparation of the electron transport layer, the hole transport layer, the active layer, and the top electrode layer of a PV device, such as the PV device 100. It will be recalled that in the example of FIGS. 1C-E, the transparent electrode layer of the PV device 100 may be formed of silver nanowire, the electron transport layer 120 may be formed of tin-oxide, the photoactive layer 122 may be formed of PV200:PCBM, the hole transport layer 124 may be formed of PEDOT:PSS, and the back contact electrode layer 126 may be formed of screen-printed silver. The root-mean-square roughness of the coated nanowire films is 11.8 nm over a 20 μm×20 μm scan range and is further reduced to 7.7 nm with the deposition of tin-oxide nanoparticles (~7 nm in size) film, which may serve as the electron transport layer in a completed PV device (as seen in the atomic force micrographs in FIGS. 2A and 2B). As noted above, a photoactive PV layer of PV2000:PCBM may be coated over the tin-oxide particles, followed by a hole-transport PEDOT:PSS layer. A relatively thick layer of the hole transport material may be coated on top of the active layer to provide sufficient protection from the mechanically abrasive process of screen-printing a silver top electrode. The relative thickness of the hole transport layer 122, in comparison to layers 116-122, is illustrated in FIG. 1D.

C. Transfer Lamination of Ultra-Thin Devices Onto Lightweight Composite Fabric

This section describes the results of tests that were performed to assess the effects of delaminating the carrier from PV devices, such as the PV device 100. According to the present disclosure, control devices were made on commercially purchased IMI on PET, and on in-house made substrates consisting of AgNW in PEDOT:PSS coated directly onto PET. It was determined that devices coated on releasable parylene, such as the PV device 100, showed similar performance to those coated directly on PET substrates, as summarized with respect to FIG. 3. Furthermore, According to the present disclosure, it was determined electronic functionality of the ultra-thin devices, such as the PV device 100, before and after release from the carrier substrate remained comparable, suggesting that delamination does not intrinsically damage the devices. In another aspect, it has been determined that the perimeter of the PV device 100 can be affixed to a plastic frame coated with double-sided adhesive, after which the carrier 112 can be delaminated from the PV device 100, thus leaving the PV device 100 in a free stranding configuration. However, because the PV device 100 is relatively thin (e.g., 20 microns), the PV device 100 may be easily damaged in this configuration.

According to the present disclosure, it has been determined that the technology described herein, which is based on a stack including a carrier (such as the carrier 112), a release layer (such as the release layer 114), and a releasable substrate (such as the substrate 116), is well-suited for direct transfer from one surface to another. It is further noted, that the technology described herein also enables the reuse of the carrier, which could lead to a further increase in the cost efficiency of the technology. (E.g., see FIG. 1H.) Transfer lamination is a well-studied process and employing thermoplastic, UV curing or pressure sensitive adhesives can allow transferring such devices onto any surface of interest.

D. Device Fabrication of Test Devices

This section describes some of the procedures followed in fabricating the test devices used to collect the data presented in the charts and plots which are discussed above with respect to FIGS. 1A-5. The test devices discussed in this section include the devices used to generate the data in Table 4. Commercially patterned ITO substrates on glass were purchased from Thin Film Devices Inc. Releasable substrates were prepared by spin-coating glass substrates with a one to three mixture of 3M Novec 1700 and 7100, at 2000 RPM for 60 seconds and subsequently depositing parylene using chemical vapor deposition. Subsequently, an ITO (35 nm)-silver (10 nm)-ITO (35 nm) stack deposited onto the substrates via RF sputtering of ITO and thermal evaporation of silver. Coating processes for all subsequent layers were the same between commercially prepared ITO substrates and homemade releasable substrates deposited on glass carriers.

The charge transport and photoactive layers were blade coated, with a blade gap of 100 um, and annealed on a hot plate set to 120° C., for three minutes. The coating speed was 100 mm/s, 12.5 mm/s, and 6 mm/s for the tin-oxide ETL, polymeric photoactive layer, and the PEDOT:PSS HTL, respectively. Bed temperature was set to 40° C. when coating the photoactive layer, and was left at room temperature for the charge transport layers. Control devices with evaporated metal contacts were made with 100 nm of thermally evaporated silver. Printed contacts were deposited via screen printing, manually drawing the squeegee across a polymeric mesh screen pre-aligned to the devices and covered with silver paste. After screen printing, the devices were dried in the oven set to 120° C. for 3 minutes.

E. Device Testing

This section describes the procedures followed in testing the test devices. Completed devices were tested inside a nitrogen-filled glovebox, under AM1.5 simulated solar irradiation (Newport™ 91195A-1000). The simulator was adjusted to 1 sun with a calibrated reference cell (Newport™, 91150-KG5) with a KG5 filter. The electrical measurements were done with a Keithley 2450™. Small-scale devices prepared on glass substrates were tested on a home-built fixture with a shadow mask with an aperture area of 0.149 cm$^2$. Modules were contacted with probe manipulators, and the module active area (7.5 cm$^2$) was calculated from the overlap between the bottom silver nanowire and top printed silver electrodes. Mechanical testing of the devices was done by manually rolling the transfer laminated devices around an optical post (Thorlabs™, TR8) and periodically testing for changes in electrical properties under AM1.5 illumination.

Sheet resistance of coated nanowires was measured with a four-point probe (ED™ Inc., RC3175 R-Check™). Atomic Force Microscopy measurements were carried out on an Asylum Research Cypher™, in the tapping mode, with Opus 160AC-NA™ cantilevers. Optical Transmittance measurements were performed on a Varian Cary 5000™, with PET and glass substrates used as reference depending on the surface the films of interest were coated on. To retain pristine surface quality of the substrates, all work was carried out in a Class 1000 cleanroom.

Although reference is made herein to particular materials, it is appreciated that other materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A device, comprising:
   a flexible carrier having a root mean square (RMS) roughness of less than 5 nm;
   a release layer that is formed on the flexible carrier;
   a releasable substrate formed over the release layer; and
   a semiconductor structure that is formed over the releasable substrate.

2. The device of claim 1, wherein the release layer is configured to facilitate clean delamination of the releasable substrate and the semiconductor structure from the flexible carrier, and the release layer is formed of a fluoropolymer material.

3. The device of claim 1, wherein the release layer is configured to facilitate clean delamination of the releasable substrate and the semiconductor structure from the flexible carrier, and the release layer is formed of a detergent material.

4. The device of claim 1, wherein the release layer is configured to facilitate clean delamination of the releasable substrate and the semiconductor structure from the flexible carrier, and the releasable substrate is formed of parylene.

5. The device of claim 1, wherein the flexible carrier is formed of polyethylene terephthalate (PET).

6. The device of claim 1, wherein the semiconductor structure includes a photovoltaic structure having a transparent electrode layer, a first transport layer, an active layer, and a second transport layer, the transparent electrode layer being disposed between: (A) the releasable substrate and (B) the first transport layer, the active layer, and the second transport layer.

7. The device of claim 1, wherein the semiconductor structure includes a photovoltaic structure having a first transport layer, an active layer, a second transport layer, and a back contact electrode layer, the first transport layer, the active layer, and the second transport layer being disposed between the releasable substrate and the back contact electrode layer.

8. A method, comprising:
providing a flexible carrier having a root mean square (RMS) roughness of less than 5 nm;
forming a release layer over the flexible carrier;
forming a releasable substrate over the release layer; and
forming a semiconductor structure over the releasable substrate to produce a transferable semiconductor device.

9. The method of claim 8, further comprising:
laminating the transferable semiconductor device and the releasable substrate over a permanent substrate; and
delaminating the flexible carrier from the transferable semiconductor device.

10. The method of claim 9, wherein the permanent substrate includes a sheet of fabric.

11. The method of claim 9, wherein the permanent substrate includes a panel of rigid or semi-rigid material.

12. The method of claim 8, further comprising:
delaminating the flexible carrier from the transferable semiconductor device; and
laminating the semiconductor structure and the releasable substrate over a permanent substrate, the permanent substrate being formed of a composite fabric.

13. The method of claim 8, wherein the release layer is configured to facilitate clean delamination of the releasable substrate and the semiconductor structure from the flexible carrier, and the release layer is formed of a fluoropolymer material.

14. The method of claim 8, wherein the release layer is configured to facilitate clean delamination of the releasable substrate and the semiconductor structure from the flexible carrier, and the release layer is formed of a detergent material.

15. The method of claim 8, wherein the release layer is configured to facilitate clean delamination of the releasable substrate and the semiconductor structure from the flexible carrier, and the releasable substrate is formed of parylene.

16. The method of claim 8, wherein the flexible carrier is formed of polyethylene terephthalate (PET).

17. The method of claim 8, wherein the semiconductor structure includes a photovoltaic structure having a transparent electrode layer, a first transport layer, an active layer, and a second transport layer, the transparent electrode layer being disposed between: (A) the releasable substrate and (B) the first transport layer, the active layer, and the second transport layer.

18. The method of claim 8, wherein the semiconductor structure includes a photovoltaic structure having a first transport layer, an active layer, a second transport layer, and a back contact electrode layer, the first transport layer, the active layer, and the second transport layer being disposed between the releasable substrate and the back contact electrode layer.

19. A device, comprising:
a permanent substrate that is formed of a composite fabric;
a transferable photovoltaic device that is laminated onto the permanent substrate,
wherein the transferable photovoltaic device includes a transparent electrode layer, a first transport layer, an active layer, a second transport layer, and a back contact electrode layer that are formed on a releasable substrate; and
wherein the transparent electrode layer, the first transport layer, the active layer, the second transport layer, and the back contact electrode layer are disposed between the releasable substrate and the permanent substrate.

20. The device of claim 19, wherein the permanent substrate includes a sheet of fabric, and the releasable substrate is 1-5 microns thick.

* * * * *